Figure 1:
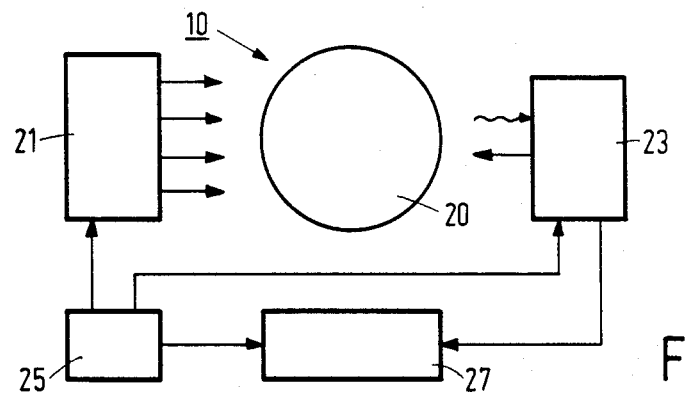

United States Patent [19]

Den Boef et al.

[11] Patent Number: 4,766,380

[45] Date of Patent: Aug. 23, 1988

[54] METHOD AND ARRANGEMENT FOR DETERMINING A NUCLEAR MAGNETIZATION DISTRIBUTION IN A PART OF A BODY

[75] Inventors: Johannes H. Den Boef, Eindhoven, Netherlands; Johannes M. Van Eggermond, Bridgeport, Conn.; Cornelis M. J. Van Uijen, Eindhoven, Netherlands

[73] Assignee: U.S. Philips Corporation, New York, N.Y.

[21] Appl. No.: 40,010

[22] Filed: Apr. 17, 1987

[30] Foreign Application Priority Data

Apr. 21, 1986 [NL] Netherlands ..................... 8601002

[51] Int. Cl.$^4$ ............................................. G01R 33/20
[52] U.S. Cl. ..................................... 324/309; 324/311
[58] Field of Search ............... 324/300, 307, 309, 311, 324/312, 313, 318, 322; 128/653

[56] References Cited

U.S. PATENT DOCUMENTS 4,443,760  4/1984  Edelstein ..................... 324/309

Primary Examiner—Michael J. Tokar
Attorney, Agent, or Firm—Thomas A. Briody; Algy Tamoshunas

[57] ABSTRACT

The invention relates to a method and system for determining an image of a nuclear magnetization distribution in a body. In known methods, particularly in nuclear spin echo techniques, a resonance signal is generated which has high dynamics. In the method according to the invention dephasing is effected which is non-linear place-dependent or which is frequency-dependent within a spectroscopy distribution, as a result of which the generated resonance signal will have a much smaller amplitude. Since the non-linear dephasing applied within the distribution is known, a correction can be made for this after the determination of the measuring signals. The non-linear dephasing can be effected by means of excitation pulses and/or with subsequent nuclear spin echo pulses (also termed refocusing pulses) which have a frequency spectrum with a non-linear phase characteristic (possibly in the presence of a gradient magnetic field), or by means of a non-linear, place-dependent extra magnetic field, which can, for example, be applied during the preparation period. The non-linear extra magnetic field will preferably have higher order components, such as quadratic components. The reduction in signal dynamics to be achieved depends on the (frequency or) place-dependence of non-linear dephasing. If, for example, in an image of n×n pixels a non-linear, place-dependent extra magnetic field is used, which is dependent on two coordinates, then it is possible to achieve a maximum reduction in signal dynamics equal to $\sqrt{n \times n}$.

34 Claims, 2 Drawing Sheets

METHOD AND ARRANGEMENT FOR DETERMINING A NUCLEAR MAGNETIZATION DISTRIBUTION IN A PART OF A BODY

The invention relates to a method for determining a nuclear magnetisation distribution in a part of a body located in a homogeneous stationary magnetic field. In such a method (a) a high frequency electromagnetic pulse is generated so as to produce a resonance signal, (b) after which, following a preparation time, a number of signal samples are taken during the time in which a resonance signal is measured, (c) after which the steps (a) and (b) are repeated several times in order to obtain a group of signal samples from which an image of the nuclear magnetisation distribution is determined after signal transformation.

The invention further relates to a system for determining a nuclear magnetisation distribution in a part of a body, which system comprises (a) means for generating of a stationary homogeneous magnetic field, (b) means for generating of high frequency magnetic radiation whose magnetic field direction is perpendicular to the field direction of the homogeneous magnetic field, (c) means for generating a gradient magnetic field, (d) sampling means for sampling the resonance signal produced by the means mentioned in (a) and (b), (e) processing means for processing the signals supplied by the sampling means into an image of the nuclear magnetisation distribution and (f) control means for controlling at least the means mentioned in (b) to (e), inclusive, for generating, conditioning, sampling and processing of a number of resonance signals.

Similar methods (also sometimes called Fourier zeugmatography) and systems are known from U.S. Pat. No. 4,070,611, as well as from the Dutch patent application No. 82.03519 and the European patent application No. 074 022. In the methods mentioned therein, the situation occurs that the generated resonance signals have a large dynamic range. The so-called nuclear spin echo technique is frequently used, since it has the advantage that the magnetisations of the nuclear spins are all in phase at a particular point of time. As a result, signal loss resulting from dephasings within a pixel is avoided. In addition, before the measurements are carried out the gradient magnetic fields can be adjusted precisely. If the nuclear spin echo technique is not used, however, it only becomes apparent afterwards whether the gradient magnetic fields have been properly adjusted, with the result that measurements sometimes have to be done again.

A further advantage of using a nuclear spin echo technique is the possibility of reducing by approximately half the number of measurements needed to code the image. A disadvantage of the nuclear spin echo technique, however, is that during the measurements the signals may vary substantially in amplitude. For this reason, very high demands are made on the dynamic range of the detection equipment. For example, it is possible that in measurements involving substantial volumes (for example, a 10 cm thick slice of the head) at high field strengths of, for example, 0.5 tesla, a dynamic range of about 20 bits is required. This is very difficult to achieve.

The object of the invention is to provide a method and system with much less stringent demands on the dynamic range of the detection equipment while maintaining all the advantages of the nuclear spin echo technique and other measuring techniques.

For this purpose, a method according to the invention is characterised in that a dephasing of excited nuclear magnetisations in the which is non-linear within the distribution is effected with the aid of a magnetic field, and in that the resulting place-dependent dephasing is compensated for before determining the image of the nuclear magnetisation distribution.

For this purpose, a system according to the invention is characterised in that it further comprises means for dephasing of excited nuclear magnetisations which is non-linear within the distribution, and also comprises means for compensating for this dephasing.

If the distribution to be determined is a place-dependent distribution, (for example, a two-dimensional density distribution) then the non-linear dephasing must be place-dependent. If the distribution to be determined is a spectroscopy distribution, then the non-linear dephasing will be introduced within the spectrum and thus be frequency-dependent.

A combination of both possibilities is, of course, also possible.

An embodiment of a method according to the invention is characterised in that during the preparation time an inhomogeneous, non-linear, place-dependent extra magnetic field is applied.

In the proposed method, during the preparation time between the excitation and the measuring time (in which the detection of the resonance signal takes place) a deliberate field inhomogeneity is introduced in such a way that at the moment at which a maximum resonance signal would occur without this field inhomogeneity, for example an echo signal in the nuclear spin echo technique, the magnetisations of the pixels are mutually out of phase. It must, however, be ensured that no excessively sharp dephasing occurs within a pixel. In the case of an image matrix of n×n pixels and an arbitrary orientation of the magnetisations of the pixels, the signal strength of the resonance signal then decreases by $\sqrt{n \times n} = n$. For $n=128$ $(=2^7)$ this means a reduction in the signal dynamics by 7 bits.

An embodiment of a method according to the invention is characterised in that the strength of the extra, dephasing magnetic field is generated with at least one of three extra partial magnetic fields, each of which is dependent on one of three orthogonal directional coordinates. According to this embodiment, it is desirable that the inhomogeneities of the extra magnetic field which are introduced should not have the shape of a linear gradient (that is, the inhomogeneity is proportional to x, y, z or linear combinations of x, y z), because then the occurrence of a high signal strength of the resonance signal is shifted to a different point of time. The inhomogeneity applied should, therefore, consist of higher order components. It is also possible to make use of the existing inhomogeneities in the stationary magnetic field already available. This has the disadvantage, however, that the adjustment of the gradient magnetic fields then becomes a laborious procedure. If extra inhomogeneities are used which are generated with extra means introduced for this purpose, then this problem does not arise. The point is that it is then possible to adjust the gradient magnetic fields, while the coils for generating the non-linear extra magnetic field are not energised. The extra magnetic field inhomogeneities are then only generated for the signal detection in the ultimate measurements. During signal detection the extra means are likewise inactive so that it does not cause image distortion or unsharpness.

Generally speaking, with the above-mentioned method the possibility of reducing the number of measurements by approximately half in Fourier zeugmatography (see Dutch patent application No. 82.03519) ceases to apply. However, if in an embodiment of the method a place-dependent non-linear extra magnetic field is used such that the field strength depends only on a coordinate direction, then it is nevertheless possible to make do with half the number of data. In practice, the experiment is then carried out in such a way that this also means a reduction of the number of measurements by the factor 2. An example of this is a two-dimensional Fourier zeugmatography experiment in which an object in the xy plane is imaged by giving the magnetisations a phase angle proportional to the y coordinate after excitation with a gradient magnetic field Gy in the arrangement (disregarding said non-linear dephasing) and then detecting the MRI signal in the presence of a gradient Gx in the x direction. For a resolution of n partial points in the y direction this scheme must generally be repeated n times, but with an ever-changing strength of the time integral of the gradient magnetic field Gy. If in an embodiment of the method a non-linear extra magnetic field is now used which depends only on the x coordinate, then a number of repetitions equal to $(n/2)+1$ if n is even, or equal to $(n+1)/2$ if n is odd, are sufficient to determine a complete image.

An embodiment of a method according to the invention is characterised in that an applied high frequency pulse has a non-linear phase spectrum.

A preferred embodiment of a method according to the invention is characterised in that the gradient direction of a gradient magnetic field present during the high frequency echo pulse with a non-linear phase spectrum coincides with the gradient direction of a linear gradient magnetic field to be applied during the measuring time. In the method according to the preferred embodiment the possibility is maintained of reducing the number of measuring cycles to (approximately) half when using (3-D) Fourier zeugmatography in the manner which is known per se. The foregoing is clear, given the fact that after the measurement and Fourier transformation of the signal samples from a measuring cycle the (non-linear) place-dependent dephasing introduced can be compensated. As a result, a spectrum is obtained which is the same as the spectrum which would have been measured without the introduction of the place-dependent dephasing.

In the case of 3-D Fourier zeugmatography it is useful to dephase the nuclear spins place-dependently in a non-linear manner and in two mutually perpendicular directions. In order to achieve this, both the 90° excitation pulse and the first subsequent 180° (refocusing pulse) echo pulse have a non-linear frequency characteristic. A linear gradient magnetic field present during the 90° excitation pulse has a gradient direction which is perpendicular to the gradient direction of the linear gradient magnetic field present during the echo pulse.

An example of an embodiment of the method according to the invention proceeds as follows. In a first measuring cycle no preparatory gradient fields are switched on. The Fourier transformation of the sampled resonance signal produces a complex spectrum of frequency elements in which the phase is determined for each frequency element. This phase (disregarding a possible constant phase error $\phi 0$, which is caused by an incorrect adjustment of the detector device) is completely determined by the preset (place-dependent) dephasing. The calculated phase angles of the measured resonance signal are stored in a memory. After this, the stored phase angles can be processed in two ways. In a first method, after Fourier transformation, a phase correction is applied to all the measurements in accordance with the phase angles stored in the memory. In the second method, the Fourier transformation of all the measurements—that is, Fourier transformation of the rows—is followed by a Fourier transformation of the points from various measurements but belonging to the same frequency (that is, Fourier transformation of the columns). After which, following application of this 2-D Fourier transformation algorithm, a phase correction is applied for each pixel in the provisional image which has already then been determined. This takes place in accordance with the phase angles stored in the memory. The correction is then a phase shift that is constant for each column, which means that this depends only on, for example, the x coordinate. The required image is only achieved after the necessary phase shift in each pixel. When using a non-linear extra magnetic field that depends on only one coordinate, however, a lower signal strength reduction is achieved. In the case of an $n \times n$ matrix the signal strength in the most favourable case will decrease by only $\sqrt{n}$ instead of $\sqrt{n \times n}$.

If the place-dependent dephasing depends on both the x and the y coordinates, after reconstruction from the real image and the complex provisional image the phase shift can be determined for each pixel and a correction can be made for this. If necessary, the phase correction is determined in advance in a calibration measurement and this is stored in a computer memory. It is pointed out that the method can be applied on any arbitrarily oriented plane, which has an effect on the usefulness of storing phase corrections. If a three-dimensional image is determined, a method according to the invention is as follows. It is assumed that the signal is measured in the presence of a gradient magnetic field Gx and that the gradient magnetic fields Gy and Gz are switched as preparation gradients. In measuring an $nx \times ny \times nz$ matrix, the signal strength is reduced by a factor equal to $\sqrt{nx \times ny \times nz}$ in the ideal case of the magnetisations being arbitrarily mutually oriented with the aid of the place-dependent dephasing. In the reconstruction of the three-dimensional image, a correction is now carried out after the 3-D Fourier transformation per volume element for the place-dependent dephasing introduced and possibly also for the constant detector phase angle $\phi 0$.

It is possible to make do with approximately half the number of measurements in the three-dimensional case as well. Then, however, it is necessary for the place-dependent dephasing to depend on only two coordinates. For example, the place-dependent dephasing may depend only on the x and z coordinates, the cycle followed in the measurement then being such that the gradient magnetic field Gy goes through half of its number of values. After 3-D Fourier transformation, the deliberately introduced phase error which is only dependent on the x and z coordinates is then corrected. This correction can also be carried out before the Fourier transformation which produces the image data as a function of the y coordinate is applied. The reduction in signal strength in the ideal case is now the factor equal to $\sqrt{nx \times nz}$, i.e. smaller than when field inhomogeneities are applied in three directions.

It will be clear that although the invention has always been explained on the basis of the known Fourier zeugmatography, the invention can also be applied in other image reconstruction methods in which nuclear resonance signals are used, such as for example projection reconstruction methods (see, for instance, Philips Technical Review, volume 41, no. 3, 1983, pages 73–89) and in determinations of spectroscopy distributions.

An embodiment of an arrangement according to the invention is characterised in that the means for generating of a dephasing which is non-linear within the distribution comprises coils for the generation of a non-linear, place-dependent extra magnetic field. An arrangement of this kind has the advantage that dynamic reduction of the nuclear resonance signal to be measured can be achieved, in which the non-linear dephasing is effected by coils, which are independent of the means required for the MRI measurements known per se. As a result, the above-mentioned means can be adjusted and used in the manner(s) known per se.

A preferred embodiment of a system according to the invention is characterised in that it comprises radio frequency means for the generation of high frequency pulses with a non-linear phase spectrum, in which respect the high frequency means comprises a single sideband modulator. The preferred embodiment of the system also has the advantage that the means needed for the MRI measurements known per se can be adjusted and used independently of the radio frequency means which bring about the non-linear (place- or frequency-dependent) dephasing. Various control signals can be supplied to the radio frequency means so that different required spectra either with or without a non-linear phase characteristic can be generated.

An embodiment of a system according to the invention is characterised in that it comprises memory means for storing values for compensating the dephasings.

An arrangement of this kind has the advantage in that the values for compensating the dephasings need not be calculated over and over again. This permits faster data processing and faster realisation of an image.

A further embodiment according to the invention is characterised in that the memory means for storing the compensation values comprises a number of memory locations which is equal to the number of pixels in a dimensional direction of a multi-dimensional image. This embodiment has the advantage in that it is possible to make do with a relatively small sized memory for the compensation values. It is, however, the case that a signal-reduction dephasing may then only be introduced in that one dimensional direction.

It should be pointed out that the use of a single sideband modulator is in itself an advantage (independently of the invention), because it can be used to good effect in various measuring methods, for example, in spectroscopy and in "multiple slice".

Figure 2:
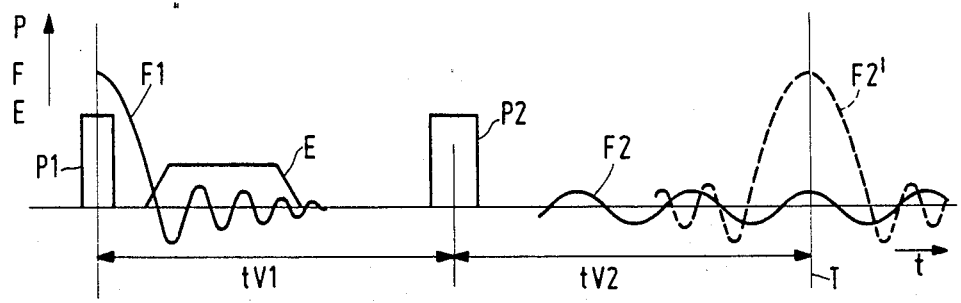
Figure 5:
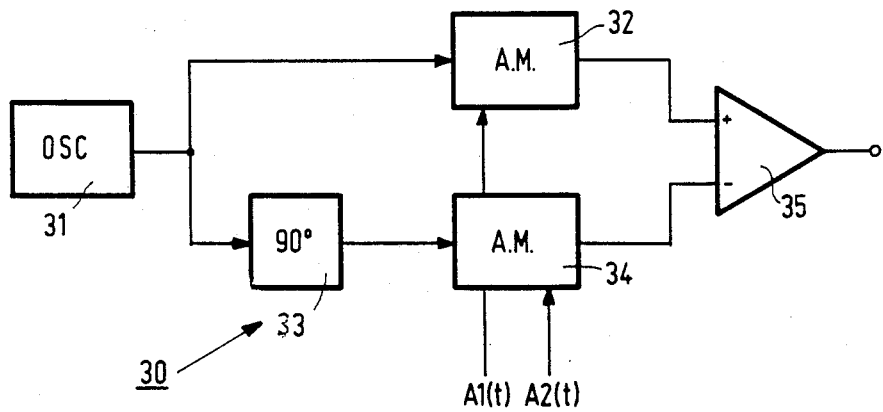
Figure 3A:
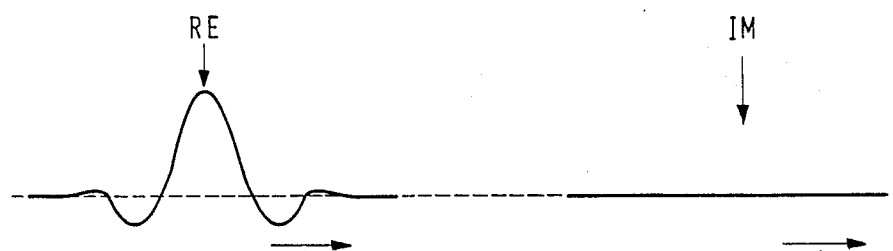
Figure 3B:
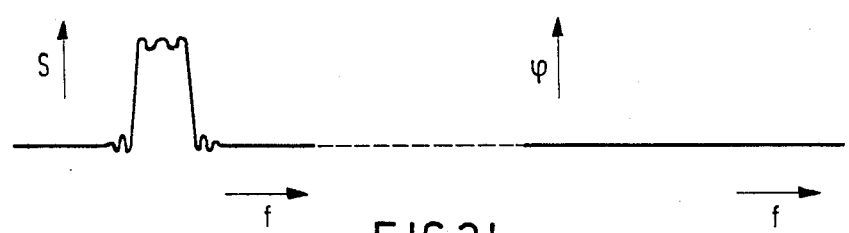
Figure 4A:
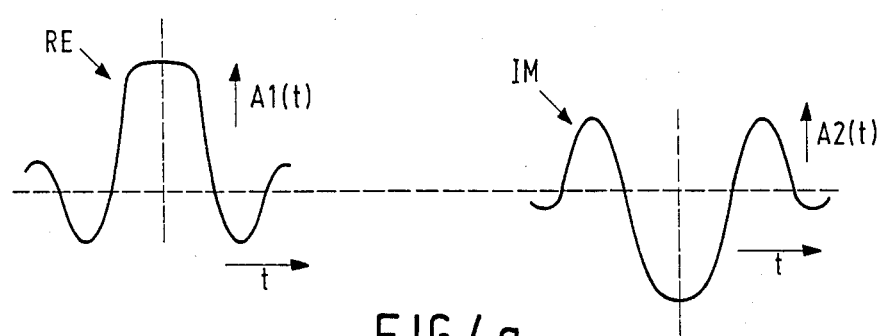
Figure 4B:
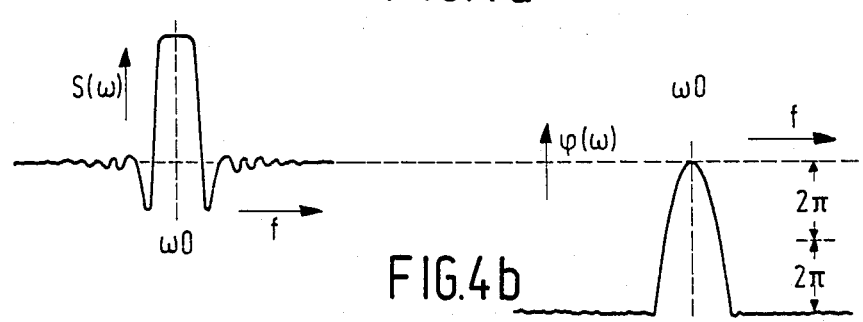

The invention will be further explained on the basis of examples shown in a drawing, in which FIG. 1 shows schematically an arrangement according to the invention, FIG. 2 shows a method according to the invention FIGS. 3a and 3b show graphs of a high frequency pulse and frequency its characteristics according to the state of the art, FIGS. 4a and 4b show graphs of a high frequency pulse and frequency its characteristic according to the invention and FIG. 5 shows schematically how a high frequency pulse with a non-linear phase spectrum can be generated.

FIG. 1 gives a schematic representation of a system 10 according to the invention, comprising a set of coils 20, a coil control device 21 which contains current generators for driving the main coils in order to generate a uniform stationary main field BO and for driving gradient magnetic coils for the generation of the linear gradient magnetic fields. The arrangement 10 further comprises a high frequency transmission and receiving section 23 with which a high frequency coil is driven. Both parts 21 and 23 are controlled by a central control unit 25 which will generally comprise a computer. The central control unit 25 also controls a signal processing and reproduction unit 27, which receives measuring signals via the high frequency transmission and receiving device 23. The operation of the arrangement 10, which is shown in FIG. 1, will be explained in further detail on the basis of a measuring diagram in accordance with FIG. 2.

The measuring diagram or method given by way of example in FIG. 2 comprises a number of measuring cycles, only one of which is shown. The measuring cycle starts with a high frequency 90° pulse p2, after which, following a waiting time tv1, the magnetisations of the excited nuclear spins are inverted with a high frequency 180° pulse p2 so that after a waiting time tv2 (tv2=tv1) an echo signal F2' is generated. Generally speaking, during the preparation time between the 90° and 180° pulse p1 and p2, linear gradient magnetic fields (for the sake of clarity not shown in the figures) will be used for coding the resonance signal F2' to be sampled. If no gradient magnetic fields are applied, however, a resonance signal (F2') will occur undisturbed and with maximum strength. The undisturbed occurrence of that maximum means that the resonance signal may have signal dynamics of the order of $2^{20}$. The foregoing means that very high demands are made on the receiving equipment 23 and particularly on the analog-digital converter section of that equipment.

An embodiment of a method according to the invention will now be given with which these large signal dynamics are reduced. In this embodiment, after a 90° pulse p1, with which a resonance signal F1 is generated, a non-linear, place-dependent extra, dephasing magnetic field E is switched on during the preparation time tv1. This non-linear extra magnetic field E causes an extra place-dependent dephasing of the nuclear spins. As the result, after a 180° pulse P2 and after the elapse of a period tv2 (=tv1) the nuclear spins do not all make a signal contribution in the same direction at the moment of the nuclear spin echo time T and, therefore, generate a resonance signal F2, the amplitude of which is much smaller than the "undisturbed" signal F2'. The extent to which a spread occurs in the phase of the various nuclear spins is determined by the strength of the non-linear extra magnetic field E and by the time during which that field is switched on.

FIG. 2 shows only one measuring cycle of the method according to the invention. The method can, for example, comprise measuring cycles as described in European patent No. 074 022, in which respect the same non-linear extra magnetic field is always switched on during the preparation time between the P1 (90°) and the P2 (180°) high frequency pulses. The invention can, of course, also be used in the methods as described in U.S. Pat. No. 4,070,611 or in the Dutch patent application No. 82.03519.

The non-linear trend of the strength of the extra magnetic field E to be generated is preferably parabolic. The magnetic field E is generated with extra coils which are added to the coils which are already necessary (main field coil BO, adjustment coils, gradient coils, transmission (and reception) coil(s)). The way in which the extra coils (not shown separately in FIG. 1) are to be arranged with respect to an object to be examined and the form which these extra coils should have can be inferred, for example, from U.S. Pat. No. 3,199,021. Although in this reference coils are described which are used precisely to eliminate non-linearities in a homogeneous, stationary magnetic field to be generated, these can also be used precisely to generate deliberate non-linearities (higher order or parabolic). Further information about the generation (compensation) of non-linear (higher order) magnetic fields can be found in U.S. Pat. No. 3,582,779 and in German patent application No. 19.46.059. It should further be pointed out that if such coils also generate linear magnetic fields (for example, linear gradient magnetic fields) besides the non-linear magnetic fields, then such fields can again be eliminated or compensated if necessary by magnetic fields which can be generated with gradient coils already present.

FIGS. 3a and 3b, respectively, show a high frequency pulse according to the state of the art and its frequency characteristic. The envelope of the high frequency pulse in FIG. 3a has a Gaussian curvature, over which a sinc function is placed, in such a way that the frequency spectrum f, which is shown in FIG. 3b, has a virtually rectangular shape with an amplitude S. The foregoing means that with such a pulse in combination with a gradient magnetic field, a relatively sharply delimited volume of an object can be selectively excited. As can be seen in FIG. 3, the phase $\phi$ is constant for the various frequencies f of the spectrum (for example $\phi=0$). The appertaining time signal is therefore a real signal RE and the appertaining imaginary part IM is therefore zero, which is indicated with a straight line in FIG. 3a.

FIG. 4a shows an embodiment of a high frequency pulse according to the invention, the signal A1(t) being the envelope of the real signal component RE and the signal A2(t) being the envelope of the imaginary signal component IM. The signals A2(t) and A1(t) are determined as follows. In the frequency domain (see FIG. 4b) a frequency characteristic is selected, the amplitude frequency characteristic S(w) of which is an approximation of a rectangle (in connection with the edge definition of a volume to be excited or to be influenced) and hence of the frequency characteristic in FIG. 3b. In this frequency characteristic S(w) a phase characteristic $\phi(w)$ is selected which has a parabolic trend (the maximum phase difference between a central angular frequency Wo and an angular Wr "at the edge" can amount to more than (many times) $2\pi$ and depends on the amount of dephasing which is allowed to occur in a pixel). The envelopes A1(t) and A2(t) can be determined from the characteristics S(w) and $\phi(w)$ selected from the FIG. 4b using a method of calculation which is known per se. The envelopes A1(t) and A2(t) are used to generate, with a high frequency oscillator, a high frequency pulse (for example a 90° pulse; 180° pulse) which has a non-linear phase shift within the distribution to be determined.

The dephasing within a pixel must not be too great, for otherwise an excessively large signal loss will occur. It can be calculated that the dephasing within a pixel at a parabolic phase shift within that pixel may be a maximum of 90° if a signal loss of about 10% in that pixel is accepted.

FIG. 5 shows a preferred embodiment of a high frequency oscillator 30 for an arrangement 10 (FIG. 1) according to the invention. The high frequency oscillator 30 comprises a constant frequency oscillator 31 and a quadrature modulator, which comprises a 90° phase shifter 33, two amplitude modulators 32 and 34 and an adder circuit 35. The high frequency signal (cos $\omega$t) generated by the oscillator 31 is supplied via the 90° phase shifter 33 to the amplitude modulator 34. The amplitude modulators 32 and 34 receive the time signals A1(t) and A2(t), respectively, in which respect A1(t) and A2(t) are the real and imaginary time signals, respectively, of the Fourier transform of the function selected in the frequency spectrum. The adder circuit 35, which in this case need only comprise a differential amplifier, receives the output signals from the two modulators 32 and 34 and adds the two signals together. The output signal of the adder circuit 35 is equal to $$S(t) = A1(t)\cos\phi t - A2(t)\sin\phi t.$$
$$= Re((A1(t) + iA2(t))\exp(i\omega t))$$

and is supplied to the high frequency coil of the set of coils 20 (FIG. 1).

What is claimed is:

1. A method for determining a nuclear magnetization distribution in a part of a body located in a homogeneous stationary magnetic field, said method comprising the steps of:
  (a) generating high frequency electromagnetic pulse so as to excite nuclear magnetizations in said part of said body and produce a resonance signal,
  (b) producing a dephasing magnetic field so as to non-linearly dephase said excited nuclear magnetizations,
  (c) taking a plurality of samples of said resonant signal during a measurement time period so as to obtain a group of signal samples,
  (d) compensating for said dephasing so as to obtain a further group of corrected signal samples, and
  (e) determining an image of the nuclear magnetization distribution from said further group of corrected sample signals.

2. The method according to claim 1, wherein said pulse generating, dephasing, sampling and compensating steps are repeated so as to obtain a plurality of said further groups of corrected sample signals, said image being determined from said corrected sample signals of said further groups.

3. The method according to claim 1 or 2 wherein the nuclear magnetization distribution is a spectroscopy distribution and the dephasing is non-linearly dependent on frequency.

4. The method according to claim 3, wherein said high frequency pulse has a non-linear phase spectrum.

5. The method according to claim 4, wherein the high frequency pulse with the non-linear phase spectrum is an echo pulse.

6. The method according to claim 4, wherein the high frequency pulse with the non-linear phase spectrum is an excitation pulse.

7. The method according to claim 5 wherein a gradient magnetic field is applied during the echo pulse.

8. The method according to claim 1 or 2 wherein said dephasing field is inhomogeneous, non-linear and place-dependent.

9. Method according to claim 8 wherein the dephasing magnetic field is generated by at least one of three extra partial magnetic fields, each of which is dependent on one of three directional coordinates which are mutually perpendicular to each other.

10. Method according to claim 9, wherein the strength of said at least one extra partial magnetic field has a parabolic trend.

11. The method according to claim 8 wherein the strength of the dephasing magnetic field has a parabolic trend.

12. The method according to claim 1 or 2 wherein said high frequency pulse has a non-linear phase spectrum.

13. The method according to claim 12, wherein said high frequency pulse with said non-linear phase spectrum is an echo pulse.

14. The method according to claim 12, wherein said high frequency pulse with said non-linear phase spectrum is an excitation pulse.

15. The method according to claim 12 wherein said non-linear phase spectrum has a parabolic trend.

16. The method according to claim 12, wherein a gradient magnetic field is applied during said pulse.

17. The method according to claim 1 or 2 including the step of applying a gradient magnetic field during said measurement time period.

18. The method according to claim 17 wherein said high frequency pulse has a non-linear phase spectrum.

19. The method according to claim 18 wherein said non-linear phase spectrum has a parabolic trend.

20. The method according to claim 18 including the step of applying a further gradient magnetic field during said pulse, the gradient direction of said further gradient magnetic field coinciding with the gradient direction of said gradient field applied during said measurement time period.

21. The method according to claim 1 or 2 wherein said high frequency pulse is an excitation pulse and has a non-linear phase spectrum and including the steps of generating a high frequency electromagnetic 180° pulse having a non-linear phase spectrum a predetermined time interval after said excitation pulse is generated so as to produce an echo signal which is sampled during said measurement time period to obtain said group of signal samples, and applying gradient magnetic fields during each of said excitation and 180° pulses, said gradient fields having gradient directions which are perpendicular to each other.

22. The method according to claim 21 including the step of applying a further gradient magnetic field during said measurement time period, said further gradient field having a gradient direction which coincides with the gradient direction of the gradient field applied during one of said excitation and 180° pulses.

23. The method according to claim 21 wherein said non-linear phase spectrum has a parabolic trend.

24. The method according to claim 3 including the step of applying a gradient magnetic field during said measurement time period.

25. The method according to claim 24 including the step of applying a further gradient magnetic field during said pulse, the gradient direction of said further gradient magnetic field coinciding with the gradient direction of said gradient field applied during said measurement time period.

26. The method according to claim 3 wherein said high frequency pulse is an excitation pulse having said non-linear phase spectrum and including the steps of generating a high frequency electromagnetic 180° pulse having a non-linear phase spectrum a predetermined time interval after said excitation pulse is generated so as to produce an echo signal which is sampled during said measurement time period to obtain said group of signal samples, and applying gradient magnetic fields during each of said excitation and 180° pulses, said gradient fields having gradient directions which are perpendicular to each other.

27. The method according to claim 26 including the step of applying a further gradient magnetic field during said measurement time period, said further gradient field having a gradient direction which coincides with the gradient direction of the gradient field applied during one of said excitation and 180° pulses.

28. A system for determining a nuclear magnetization distribution in a part of a body comprising:
 (a) means for generating a stationary homogeneous magnetic field in a region wherein said part of said body is located,
 (b) means for generating a high frequency electromagnetic pulse whose magnetic field direction is perpendicular to the field direction of said homogeneous magnetic field so as to excite nuclear magnetizations in said part of said body and produce a resonance signal,
 (c) means for generating a gradient magnetic field in said region,
 (d) means for non-linearly dephasing said excited nuclear magnetizations,
 (e) means for sampling said resonance signal so as to obtain a plurality of sample signals,
 (f) means for compensating for said dephasing so as to produce a plurality of corrected sample signals,
 (g) means for producing an image of the nuclear magnetization distribution in said part of said body from said corrected sample signals.

29. The system according to claim 28 wherein said dephasing means includes means for generating a non-linear, place dependent magnetic field.

30. The system according to claim 28 wherein said electromagnetic pulse has a non-linear phase spectrum.

31. The system according to claim 30 wherein said pulse generating means comprises a single sideband modulator.

32. The system according to claim 28 wherein said compensating means includes memory means for storing values for compensating for said dephasing.

33. The system according to claim 32 wherein said memory means comprises a number of memory locations which is equal to the number of pixels in a dimensional direction of a multi-dimensional image.

34. The system according to claim 33 wherein said memory means comprises a number of memory locations equal to the number of pixels of an image of the distribution to be determined.

* * * * *